DIFFERENTIAL AMPLIFIER WITH COMMON MODE REJECTION
Filed Sept. 22, 1964
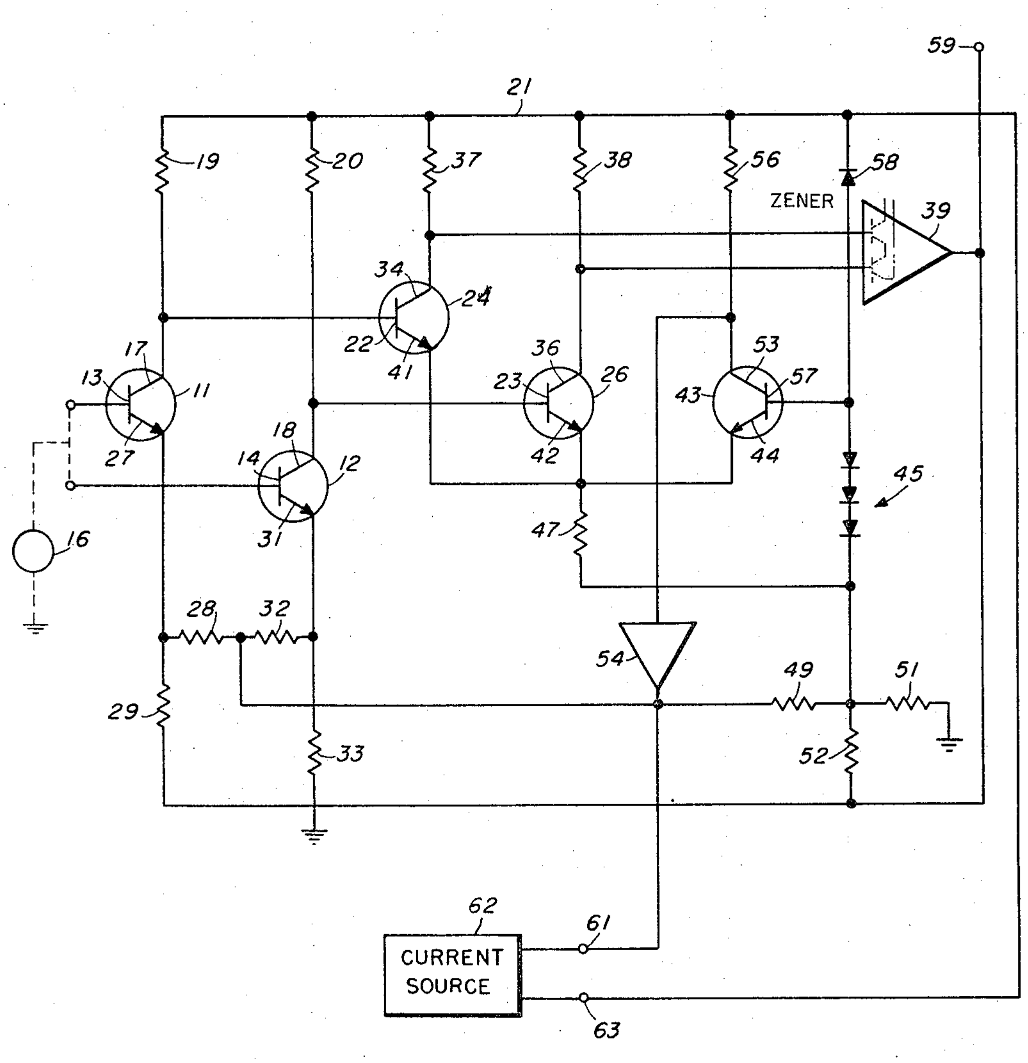
INVENTORS
WILLIAM G. ROYCE
BY DAVID N. PETERSEN
Richard K. Macneill 3,370,245

DIFFERENTIAL AMPLIFIER WITH COMMON MODE REJECTION

William G. Royce and David N. Petersen, San Diego, Calif., assignors, by mesne assignments, to Honeywell Inc., Minneapolis, Minn., a corporation of Delaware Filed Sept. 22, 1964, Ser. No. 398,277
4 Claims. (Cl. 330—30)

ABSTRACT OF THE DISCLOSURE

The present invention relates to a differential amplifier and more particularly to a differential amplifier with a high common mode voltage rejection factor. The common mode voltage rejection is accomplished by means of feedback to differentially connected amplifier stages. Moreover, a supply source and a single-ended output are referenced to the common mode rejection network.

The DC amplifier for telemetry use or data amplification must meet stringent specifications. This type of amplifier must have a differential input and a single ended output which is extremely stable over a wide temperature range with wide frequency response and high input impedance. These requirements are relatively easy to achieve through proper design parameters. The one extremely difficult requirement to achieve is that of a high common mode rejection factor. The present invention is primarily directed to this last requirement, that of high common mode rejection.

According to the invention, a differential input, DC amplifier, having a single ended output is provided in which a sample of common mode voltage is detected and fed back for effective cancellation of any adverse effects of any common mode voltage at the input of the amplifier. The voltage supply is also referenced to the common mode voltage for further nullifying any adverse effect upon a signal translation that a common mode voltage may have.

A further novel feature lies in the effective cancellation of signal-induced feedback voltage in the common mode feedback channel.

An object of this present invention is the provision of a differential amplifier having a high common mode voltage rejection factor.

Another object is to provide a differential amplifier with high stability over a wide temperature range.

A further object of the invention is the provision of a differential amplifier which obviates the necessity for stringent power supply requirements.

Still another object is to provide a differential amplifier which is simple, relatively inexpensive and requires a minimum of maintenance and adjustment.

Other objects and many of the attendant advantages of this invention will be readily appreciated as the same becomes better understood by reference to the following detailed description when considered in connection with the accompanying drawing in which the sole figure is a schematic representation of the preferred embodiment of the present invention.

Referring to the drawing, a differential amplifier is shown having a pair of input stages comprising transistors 11 and 12 having bases 13 and 14, respectively, connected together at common mode voltage generator 16, the other side of which is connected to ground. Collectors 17 and 18 of transistors 11 and 12, respectively, are connected through resistances 19 and 20, respectively, to positive bus 21 and to bases 22 and 23, respectively, of transistors 24 and 26, respectively. Emitter 27 of transistor 11 is connected to a junction of resistance 28 and resistance 29. Emitter 31 of transistor 12 is connected to a junction of resistance 32 and resistance 33.

Collectors 34 and 36 of transistors 24 and 26, respectively, are connected through resistances 37 and 38, respectively, to bus 21 and to inputs of amplifier 39. Amplifier 39 provides a "single-ended" output at output terminal 59.

Transistor 43 has emitter 44 connected to emitters 41 and 42 of transistors 24 and 26, respectively, through resistance 47 to one end of diode string 45 and to a junction of resistances 49, 51 and 52. Collector 53 of transistor 43 is connected to an input of common mode voltage amplifier 54 and through resistance 56 to bus 21. Base 57 of transistor 43 is connected to the other side of diode string 45 and through zener diode 58 to bus 21. Output terminal 59 is connected to the other side of resistance 29 and to the other side of resistance 52. The other side of resistances 32 and 28 and 49 are connected to the output of amplifier 54. The other side of resistances 33 and 51 are connected to ground.

Positive terminal 63 of current source 62 is connected to bus 21, and negative terminal 61 of current source 62 is connected to the output of common mode voltage amplifier 54.

OPERATION

Before describing the operation of the present invention reference is made to the article by R. D. Middlebrook entitled Differential Amplifier With Regulator Achieves High Stability, Low Drift, published in Application Data by Fairchild Silicon Transistors, December 1961. This article discusses the general problems encountered in nullifying the effects of common mode voltages in differential DC amplifiers.

A common mode voltage will appear as a voltage applied to the inputs of the differential amplifier and is represented by a generator shown at 16 connected to both base 13 and base 14 of transistors 11 and 12, respectively. Actually, of course, this connection is not made but the two inputs are isolated and a differential input voltage applied thereto. This normal mode voltage is then differentially applied to bases 13 and 14 of transistors 11 and 12, respectively, further amplified in transistors 24 and 26 and applied to amplifier 39 which through conventional means converts the differential signal into a single ended signal at output terminal 59.

If there is a common mode voltage represented by common mode voltage generator 16 applied to both input terminals, this voltage will also be amplified in transistors 11 and 12 and further amplified in transistors 24 and 26. Emitters 41 and 42 of transistors 24 and 26 are connected to a common emitter resistance 47 across which the common mode voltage will appear. The differential voltage or normal mode voltage will cancel at this point since each transistor will be 180° out of phase with the other. The common mode voltage developed across resistance 47 is applied to transistor 43 via emitter 44, amplified and coupled to common mode voltage amplifier 54 from collector 53 of transistor 43.

The gain of common mode voltage amplifier 54 is set so that 1.11 or 10/9 times the input common mode voltage is present at the output of amplifier 54. This voltage is then applied to input emitters 27 and 31 through resistances 28 and 32. Resistances 28 and 32 are nominally 10K ohms, respectively, and resistance 33 90K ohms which supplies a 9 to 10 division leaving 1.0 common mode voltage present at emitters 27 and 31 of input transistors 11 and 12, respectively. This will effectively cancel adverse effects of the common mode voltage present at bases 13 and 14 of transistors 11 and 12, respectively.

Also, coupled to the output of common mode voltage amplifier 54, is a voltage divider comprising resistances 49, 51 and 52. Typical values of this divider are resistance 49, 1K, resistances 51 and 52, 18K. This also effectively supplies a 9 to 10 voltage division since resistances 51 and 52 can be considered in parallel with each other and in series with resistance 49. The junction of these three resistances is brought up through diode chain 45 and zener diode 58 to supply bus 21 the positive voltage supply line of the first 4 transistors in the amplifying chain. This bus is further tied to the positive side of current source 62 at 63. Another output of amplifier 54 is directly tied to the negative supply of current source 62. The emitter to collector voltage supply is then referenced to the common mode voltage to obviate any difficulties in operating characteristics of any stage by moving the voltage supply of the entire input stages of the amplifier around any common mode voltage present at its input.

A further difficulty could be encountered because of the negative or degenerative feedback from the output voltage at terminal 59 through resistance 29 to emitter 27 of input transistor 11. This feedback is not applied directly to the other channel, i.e. input transistor 12, because the output at terminal 59 is single ended. This feedback voltage which is a result of a normal mode voltage and not a common mode voltage, is then applied through resistance 28 to the common mode voltage feedback channel and will look like a common mode voltage even though none may be present at the input terminals. A signal will then appear across emitter resistance 47 which looks like a common mode voltage and will be amplified in transistor 43 and applied to common mode amplifier 54.

The aforementioned change in the output of amplifier 54 resulting from a normal mode signal is a necessary and usual condition. Without resistance 52, this change would appear as a common mode voltage to amplifying chain by means of the coupling through the divider 49 and 51, the diode chain 45, and the Zener diode 58 to supply bus 21. The function of resistance 52 is to supply an additional feedback derived from the output 59 so as to effectively cancel at the junction of 49, 51, and 52 the output change of amplifier 54 due solely to a normal mode signal. The relative proportions of resistances 49, 51, and 52 are so chosen in relationship to the proportions of resistances 28, 29, 32 and 33 that the voltage at the junction of 49, 51 and 52 changes only in response to, and by an amount equal to the applied common mode voltage. It should be understood, of course, that the common mode voltage is by its nature, and the connections shown in the figure, the mean voltage of the input bases 13 and 14.

It should be understood, of course, that the foregoing disclosure relates to only a preferred embodiment of the invention and that it is intended to cover all changes and modifications of the example of the invention herein chosen for the purposes of the disclosure which do not constitute departures from the spirit and scope of the invention.

We claim:

1. A directly coupled differential amplifier comprising:
first and second amplifier means,
said first and second amplifier means adapted to receive input signals such that differential amplification is effected,
common mode voltage detecting means connected to said first and second amplifier means,
voltage amplifier means,
voltage divider means,
said voltage amplifier means connected to said common mode voltage detecting means to operate upon the voltage detected thereby,
said voltage divider means connected to said first and second amplifier means and to said voltage amplifier means such that only a portion of the signal produced by said voltage amplifier means is supplied to said first and second amplifier means,
current source means connected to each of said amplifier means and to said voltage amplifier means such that the common mode voltage and the signal provided by said source means are correlated, means for combining any differential signal present in said directly coupled differential amplifier into a single-ended output, and feedback means coupling said single-ended output to said first and second amplifier means.

2. The directly coupled differential amplifier recited in claim 1 including further feedback means connected between said single-ended output and said voltage amplifier means to cancel the effect of normal mode voltage changes at the output of said voltage amplifier means.

3. The directly coupled differential amplifier recited in claim 1 wherein each of said first and second amplifier means includes a plurality of amplifier stages, each of said stages being connected in a differential amplification configuration.

4. The directly coupled differential amplifier recited in claim 1 including second feedback means providing a degenerative feedback path between said single-ended output and at least one of said first and second amplifier means.

References Cited

UNITED STATES PATENTS

| | | | |
|---|---|---|---|
| 3,046,487 | 7/1962 | Matzen | 330—19 |
| 3,168,708 | 2/1965 | Stuart-Williams et al. | 330—22 |
| 3,189,840 | 6/1965 | Braymer et al. | 330—25 |

ROY LAKE, *Primary Examiner.*

NATHAN KAUFMAN, *Examiner.*

E. C. FOLSOM, *Assistant Examiner.*